(12) United States Patent
L'Henaff et al.

(10) Patent No.: US 6,953,895 B2
(45) Date of Patent: Oct. 11, 2005

(54) ELECTRONICS HOUSINGS AND ASSOCIATED CONNECTORS FOR CABLE/WIRING DISTRIBUTION SYSTEM

(75) Inventors: Jean-Jacques L'Henaff, New York, NY (US); William H. Cowles, New York, NY (US); Peter Jay Schwartz, Fullerton, CA (US)

(73) Assignee: Terk Technologies Corporation, Commack, NY (US)

( * ) Notice: Subject to any disclaimer, the term of this patent is extended or adjusted under 35 U.S.C. 154(b) by 0 days.

(21) Appl. No.: 10/669,895

(22) Filed: Sep. 24, 2003

(65) Prior Publication Data

US 2004/0112623 A1 Jun. 17, 2004

Related U.S. Application Data

(60) Provisional application No. 60/413,708, filed on Sep. 26, 2002, and provisional application No. 60/438,276, filed on Jan. 6, 2003.

(51) Int. Cl.⁷ .................................................. H02G 3/18
(52) U.S. Cl. ........................ 174/59; 174/50; 385/135; 439/527
(58) Field of Search ............................. 174/50, 59, 61, 174/48, 135, 68.1, 17 R, 58; 361/600, 601, 602, 641, 760, 726, 759, 807, 810, 825; 439/527, 539, 532, 716; 248/906, 231.9, 220.21; 220/3.2, 3.4, 3.8, 4.02; 385/134, 135

(56) References Cited

U.S. PATENT DOCUMENTS

| | | | |
|---|---|---|---|
| 4,800,465 A | * | 1/1989 | Rodgers et al. ............. 361/835 |
| 5,093,885 A | * | 3/1992 | Anton ......................... 385/134 |
| 5,975,769 A | * | 11/1999 | Larson et al. ................ 385/134 |
| 6,122,160 A | * | 9/2000 | Hannula ...................... 361/600 |
| 6,132,242 A | | 10/2000 | Hall et al. |
| 6,259,850 B1 | * | 7/2001 | Crosby et al. .............. 385/134 |
| 6,266,250 B1 | | 7/2001 | Foye |
| 6,353,183 B1 | * | 3/2002 | Ott et al. ....................... 174/59 |
| 6,444,906 B1 | * | 9/2002 | Lewis ......................... 220/3.8 |
| 6,445,865 B1 | * | 9/2002 | Janus et al. ................... 174/59 |
| 6,547,587 B2 | * | 4/2003 | Hurst et al. ................. 439/716 |
| 6,574,121 B1 | * | 6/2003 | Franz et al. ................ 361/825 |
| 6,597,576 B1 | * | 7/2003 | Smith et al. ................ 361/825 |
| 6,728,098 B1 | * | 4/2004 | Brostom ..................... 361/600 |
| 6,826,058 B1 | * | 11/2004 | Cafferty et al. ............. 361/825 |

\* cited by examiner

*Primary Examiner*—Dean A. Reichard
*Assistant Examiner*—Angel R. Estrada
(74) *Attorney, Agent, or Firm*—Gerald T. Bodner

(57) ABSTRACT

An optional surface fastening system for an electronics housing facilitates its attachment to pre-manufactured fixed panel systems, enclosures and the like. The electronics housing has primary holes or slot features that interface standard screw hardware in order to fasten to varied surfaces or accepts specially designed connector pieces to mechanically attach to the aforementioned fixed enclosures. Connector pieces, designed to interface with any panel system, may be replaced interchangeably and are temporarily fixed by a snap detail located on the primary slots. Method of attaching the electronics housing to a fixed panel system requires integrated pin features on the connector pieces, employed to locate to corresponding holes on the fixed panel, in conjunction with operative rotation of a specialized pin feature to temporarily lock the electronics housing to the panel system. Conversely while attached, operative rotation of the specialized pin feature disengages the electronics housing from the fixed panel system.

10 Claims, 13 Drawing Sheets

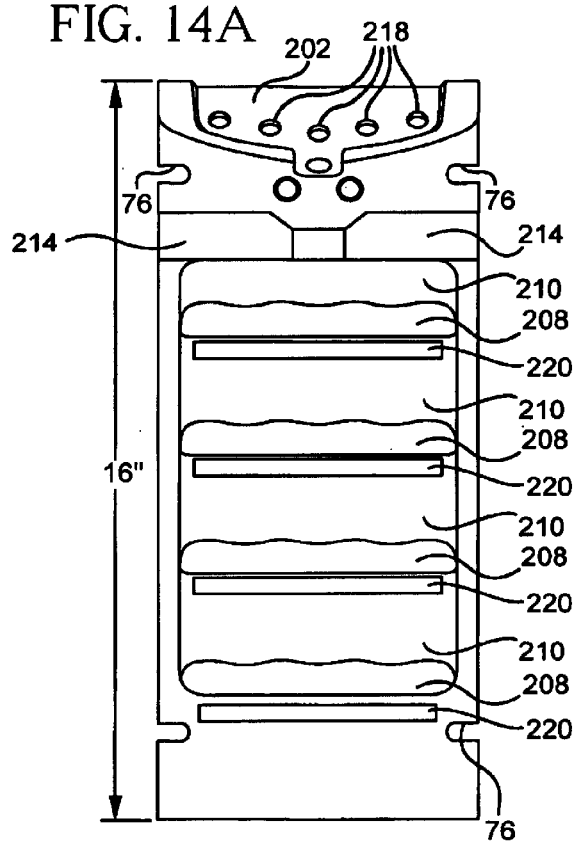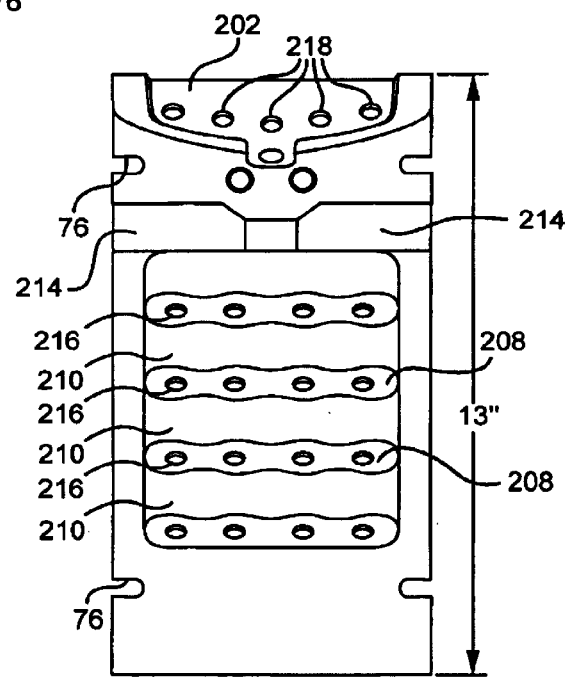

ELECTRONICS HOUSINGS AND ASSOCIATED CONNECTORS FOR CABLE/WIRING DISTRIBUTION SYSTEM

CROSS REFERENCE TO RELATED APPLICATIONS

This application claims the benefit of Provisional Patent Application Ser. Nos. 60/413,708 and 60/438,276, filed Sep. 26, 2002 and Jan. 6, 2003, respectively, each having the title "Electronics Housings and Associated Connectors for Cable/Wiring Distribution System," the disclosures of which are incorporated herein by reference.

BACKGROUND OF THE INVENTION

1. Field of the Invention

This invention relates generally to the field of mounting systems for electronics housings (modules). In particular, embodiments of the present invention relate to an optional mounting system to facilitate mounting the electronics housing to pre-manufactured enclosures with varied hole pattern designs. More specifically, the process of attaching the housing using a camming feature allows the electronics housing to be securely attached and removed with the same methodology. Furthermore, the connector system distinguishes the system from current products within its product category as it can be easily removed from the electronics package so that the unit can mount to a variety of surfaces using conventional hardware.

2. The Relevant Technology

Signal management technology generally resides within a building and is typically installed on a wall, ceiling, or other similar surface. Signal management (SM) refers to the sending, receiving and manipulation of transmittable frequencies through wire-based systems. Specialized signal manipulation equipment such as splitters, diplexers, amplifiers and modulators requires a hub or organized panel to facilitate installation, serviceability and access. As with professional stereophonic equipment, signal management has specialized fixturing cabinets or sheet metal enclosures called "cans." Modified slightly from manufacturer to manufacturer, they interface and organize products designed specifically to fit that enclosure design.

Typical enclosures are sheet metal fabrications of a singular punched and bent sheet of metal forming a rectangular, five-sided box. When formed, there is a back panel (also referred to as a "back plate") perforated with a series of uniform punched holes, a top, bottom and two sides. A return flange completes the enclosure front, leaving an opening slightly smaller than the dimensions of the back panel. The enclosure width is determined by a standard set by the linear space roughly equal to the distance between two wall studs in a typical stud and sheetrock constructed wall. The depth of the enclosure relates specifically to the stud depth plus the thickness of the sheetrock. When installed, the sheet metal enclosure is mechanically fastened with screws to adjoining studs on both sides of the enclosure and the front return flange surface should lie just below flush from the drywall outer surface. The "can" defines a fixed, accessible space protected on five sides within the wall structure of a building. A door or access panel, flush with the exterior wall surface, completes the installation of the can.

Cable routing occurs through the building's wall and floor system. The "can" acts as the distribution hub or manifold from which raw electronic signals passing through wires from satellite dishes, exterior cable signal, TV antenna, and signal producing devices are manipulated and distributed throughout the building to signal output devices (i.e., stereo equipment, video displays, etc . . . ).

The hole pattern located on the back panel of the enclosure provides the means for quick and secure attachment of SM electronics housings. The enclosure hole pattern is standardized with four vertical rows of evenly spaced holes divided into two columns. The lateral (i.e., horizontal) distance between the centers of the typical 0.25" diameter holes per column is standardized at 6.0". The vertical distance between the hole centers is standardized at 0.50" although one manufacturer offers a hole pattern at 1" spacing on the left side, staggered 0.50" from the 1" vertically spaced holes on the right side of the column.

Most often, the general shape of the holes varies between manufacturers with features like slots punched additionally with each hole, or rectangular shapes taking the place of circular holes. Conventional SM electronics housings are designed specifically to fit a single hole pattern design, and more often than not, it is difficult to mount electronics housings of one manufacturer into an enclosure of another. For example, one electronics housing platform is constructed of sheet metal fitted with hooks along the top with an additional hook on the lower left side and with a snap feature at the lower right. To fit this housing into a competitor's can, the installer must use a pair of pliers to bend one of the metal hooks that interferes with a missing hole in the metal enclosure, a process that is not only time consuming but also reduces the intended strength of the mount. In another instance, an electronics housing that does not have features to fit a non-circular hole pattern design is a very loose fit when mounted to an enclosure with square holes. Moreover, attaching an electronics housing upside down (in some cases, this is preferred for better cable management) cannot be accomplished with the rectangular hole arrangement because fixed features on the housing are designed to interface with the enclosures only in an upright position.

Fixed hooks in conjunction with fixed push-button snaps are the primary means of attaching SM electronics packages to SM electronics enclosures. Horizontal and/or vertical hooks are employed to align with corresponding holes in the enclosure, pushed through to hang the package on horizontal surfaces provided by the hole features. The third or fourth point of contact (depending on the size, shape, and design of the existing housing) is the push-button snap. The push-button snap is a two-part, plastic assembly that is cylindrical in shape with a lead-in alignment feature to mate with its corresponding hole. Once the snap passes through the hole, the user presses operatively to wedge the outer portion, creating excess interference with the diameter of the hole on the sheet metal enclosure. The mounted housing can also be removed with some difficulty due to the size and subsequent forces needed to overcome the pre-tensioned wedge without plier tools using the grip of two fingers.

An additional problem with current electronics housings is that the fixed hook features found on existing SM electronics housings are often over-tolerated to compensate for the manufacturing methods used and therefore are loose and rely on a single cylindrical plastic snap to take up the tolerances and provide rigidity to the installed unit. Finally, many if not all of the existing enclosure-mountable electronics housings do not have readily apparent features to install the units outside of the can. Two conventional enclosures and their associated electronics housings are described in U.S. Pat. No. 6,266,250 to Richard T. Faye, and U.S. Pat. No. 6,132,242 to Lawrence Alton Hall and William John Schnoor, the disclosures of which are incorporated herein by reference.

Therefore, there is a need for an electronics housing to give the installer the option to fasten the housing with equal ease to a generic surface or to a pre-manufactured enclosure. It would be beneficial if the locking portion of the enclosure mount system could be installer defined. In other words, by allowing the housing securing means to be moved from one side of the electronics housing to the other, the SM housing can either be placed right-side up or upside-down and keep the locking connector part on the optimum side for installation. Conversely, when a left hand installation on the right column of the can is necessary, a left-handed installer can complete the task easily and without discomfort by preferencing the lock feature on the left side of the housing. More importantly, if the connector pieces could interface with all existing SM enclosure systems with equal ease during installation and retain a consistent mechanical fit once installed, this would be ideal. By default, if individual connector pieces could be attached and removed from the electronics housing, newly designed connector pieces could be created for future, not-yet realized panel hole designs without expensive tooling and mold changes to the SM electronics housings.

OBJECTS AND SUMMARY OF THE INVENTION

It is an object of the invention to provide an electronics housing for a signal management (SM) system which is universally adaptable to be installed in enclosures of conventional SM systems.

It is another object of the present invention to provide a modular signal management (SM) electronics housing which gives the installer the option to fasten the housing with equal ease to a generic surface or to a pre-manufactured enclosure.

It is a further object of the present invention to provide a signal management (SM) electronics housing having securing means which may be moved from one side of the electronics housing to another side.

It is yet another object of the present invention to provide an electronics housing for a signal management (SM) system which may be mounted in a pre-manufactured enclosure either right-side up or upside-down.

It is a still further object of the present invention to provide an electronics housing for a signal management (SM) system which facilitates the connection of individual electrical wires to the housing.

It is still another object of the present invention to provide a signal management (SM) electronics housing which defines channels for the management of electrical wires connected thereto and to other electronics housings.

It is still a further object of the present invention to provide a signal management (SM) system which includes an electronics housing and an enclosure for receiving the housing which overcomes the inherent disadvantages of conventional SM systems.

In one form of the present invention, an electronics housing for a signal management (SM) system includes a housing structure which defines an enclosure for containing therein electronic circuitry. The housing structure is mountable on a supporting structure, which is preferably a cable or wire distribution enclosure, which includes at least a back plate or panel having a plurality of spaced apart holes arranged in columns and rows. The housing structure further has at least two opposite walls, such as left and right side walls of the structure. Each of the two opposite walls has formed therein an open slot.

The electronics housing also includes a plurality of connectors. Each connector of the plurality of connectors is receivable in a corresponding one of the open slots. The connectors are used to attach the electronics housing to the supporting structure.

Each of the connectors may be either a passive connector or an active locking connector. The passive connector includes a main connector body and a non-rotatable pin which is mounted on and extends from the main connector body. The non-rotatable pin includes a camming surface formed thereon.

The active locking connector also includes a main connector body, and a rotatable pin which is rotatably mounted on and extends from the main connector body. The rotatable pin of the active locking connector also includes a camming surface formed thereon.

The active locking connector and the passive connector are interchangeable in either of the open slots formed in the opposite walls of the housing structure. The pins of the connectors are received in holes formed in the supporting structure. By rotating the pin on the active locking connector, the camming surface thereon engages the edge of the respective hole in which it is received, and causes the camming surface of the non-rotating pin of the passive connector to engage the edge of the hole by which it is received. This camming action selectively secures the electronics housing to the supporting structure until it is desired by the installer to remove the electronics housing from the supporting structure.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 14A and 14B are front views of the electronics housing shown in FIG. 13, in partially fabricated form and in two different sizes.

DETAILED DESCRIPTION OF THE PREFERRED EMBODIMENTS

Figure 1:
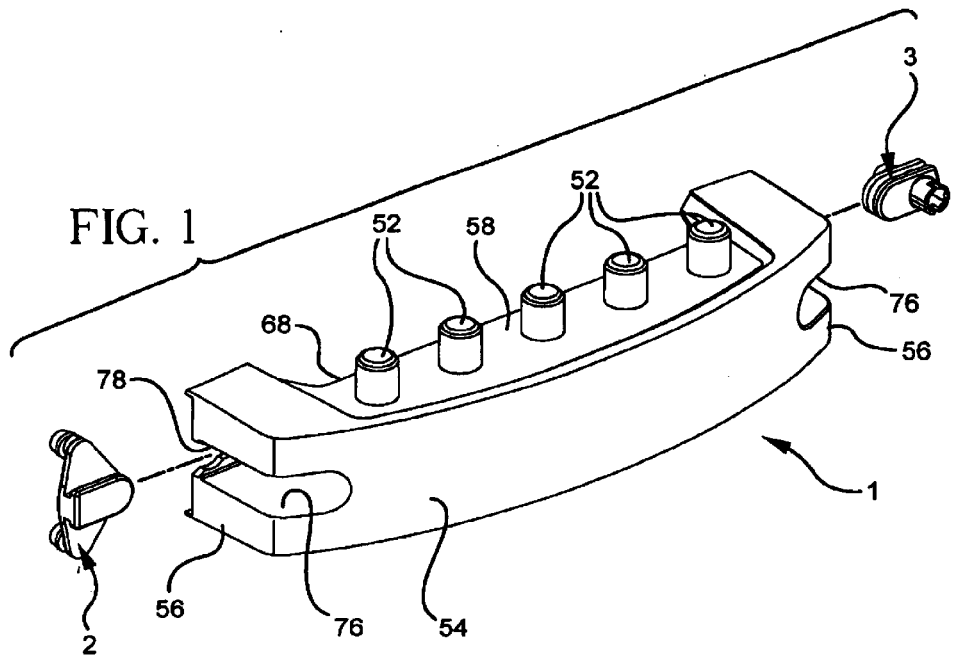
FIG. 1 is a front isometric view of an electronics housing and associated connectors for the housing formed in accordance with the present invention.

Two very significant features of the electronics housing 1 and associated connectors of the present invention relate to their interchangeability and adaptability. As will be described in greater detail, and as shown in FIG. 1 of the drawings, the passive connector 2, shown on the left side of the electronics housing 1, may be interchanged with the active locking connector 3 shown on the right side of the housing. This may be important to the installer, as sometimes access to either the left or right side of the enclosure may be difficult or hindered for one reason or another, or the installer may be right-handed or left-handed and desires to place the active locking connector on one side or the other. Such interchangeability is not possible with the electronics housings shown in either U.S. Pat. Nos. 6,266,250 or 6,132,242.

Second, the electronics housings 1 of the present invention and associated connectors are quite adaptable in that different connectors for mounting the housings to various conventional enclosures may be removeably mounted to the electronics housings to provide the necessary alignment with the holes formed in the back plate of the enclosures. As will be described in greater detail, many of these enclosures have holes formed in their back plates that may or may not be offset from one another. The removeability and adaptability of the various connectors formed in accordance with the present invention allow the electronics housings of the present invention to be mounted to many, if not all, conventional enclosures presently on the market. Again, such structural features and advantages are not found in the electronics housings disclosed in the aforementioned U.S. Pat. Nos. 6,266,250 and 6,132,242.

Figure 1A:
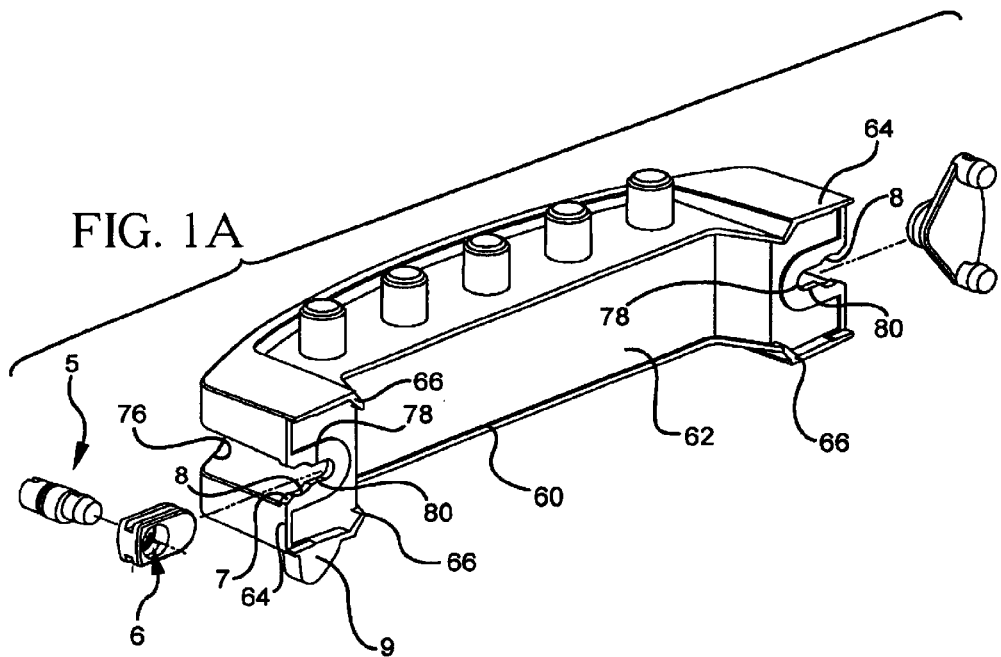
FIG. 1A is a rear isometric view of the electronics housing and associated connectors shown in FIG. 1.

FIGS. 1 and 1A show the front and rear, respectively, of an electronics housing 1 formed in accordance with the present invention. This particular electronics housing contains the electronic circuit for a four-way splitter. Five coaxial cable connectors 52 are shown residing on and extending from the top surface of the housing, where one coaxial cable connector 52 receives a satellite or cable signal, which is connected to the electronic circuit (not shown) contained in the housing. The electronic circuit divides the input signal into four output signals, which are provided to the four remaining coaxial cable connectors 52 for distribution to various rooms or apartments in the dwelling in which the signal distribution system (of which the electronics housing 1 forms a part) is located.

The housing 1 has a preferably concave front wall 54, side walls 56, top and bottom walls 58, 60 and a rear wall 62 to form an enclosure for the electronic circuitry and which protects the electronic circuitry from dust, dirt, moisture and other environmental elements which may affect the performance of the electronic circuitry housed therein. Lateral (left and right) wall sections 64 extend beyond the rear surface 62 of the housing and define a flat, planar edge 66 of each extended lateral portion which is adapted to lie flush against the back plate of the enclosure when the electronics housing is mounted thereon. It should also be noted that the lateral extended portions 64 are larger in height than the middle portion of the housing so as to provide a firm footing for mounting the housing against the back plate of the enclosure in order to provide stability and prevent the housing from rocking on the back plate when attached thereto.

Also, since the lateral sides 64 of the housing extend backward beyond the rear surface 62 of the housing, providing the housing with an overall protruding "handle" shape, the rear wall or surface 62 of the housing is spaced from the back plate of the enclosure when the housing is mounted thereon, and defines with the housing side walls 56 and enclosure back plate a channel 68 for routing coaxial cables or other wiring between the rear wall of the housing and the back plate and thus securing the cables in place in the enclosure.

Figure 11:
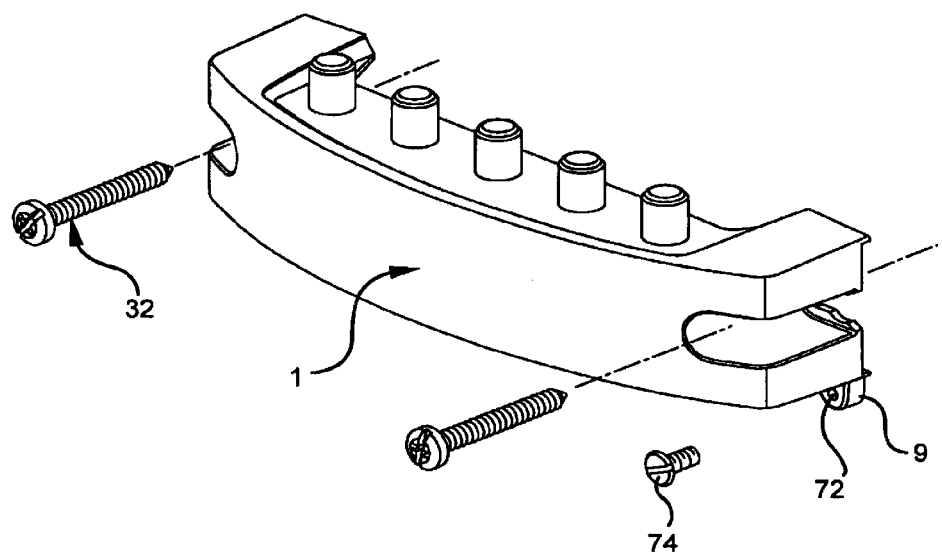
FIG. 11 is a front isometric view of an electronics housing formed in accordance with the present invention, demonstrating its adaptability for connecting the same to the enclosure back plate or other flat surface using standard screws.

As can be seen in FIG. 1A, and partially shown in FIG. 11, a flange or tab 9 extends outwardly from the housing and includes a threaded hole 72 into which a machine screw 74 is rotatably held captive. The screw 74 is provided as a ground connection for the housing, that is, to connect the housing to a separate ground wire. The housing itself is preferably made of metal, which helps minimize any leakage fields or electromagnetic interference (EFI) caused by the electronic circuitry contained within the housing.

As can be seen from FIGS. 1 and 1A, the lateral extended portions 64 are split to define an open pocket 76 on each side of the housing (between upper and lower portions of the lateral extensions 64). As will be seen, the open pocket 76 serves to provide access to the connectors of the present invention which are used for mounting the electronics housing 1 to the back plate of the enclosure.

As shown in FIG. 1A, the rear surface of each lateral extension 64 is formed with a key hole 78 which is aligned with the open pocket 76. The key hole 78 is provided to receive and removeably secure therein the connectors 2, 3 used for mounting the electronics housing to the enclosure. More specifically, the key hole 78 is shaped with an enlarged leading opening 8 which extends to a narrower, elongated slot 80. The enlarged opening 8 is circular or arcuate in shape so that it may closely receive and removeably secure therein the connectors 2,3 for mounting the electronics housing to the enclosure. Each key hole 78 is also preferably defined by angled sidewalls 7 at its entranceway which lead to the enlarged diameter portion 8 of the key hole, which facilitates the user inserting the selected connector into the key hole.

As can be seen from FIG. 1 and FIG. 1A, and as previously described, connectors 2, 3 are provided to removeably mount the electronics housing 1 to the enclosure, and each connector is received by a corresponding key hole 78 and is removable therefrom so that other connectors may be substituted therefor, as needed. One connector 2 (i.e., a "passive" connector) is shown with two extending pins 10, and the other connector 4 is shown as an active locking connector formed of a connector body 6 and an insertable pin 5.

Figure 2A:
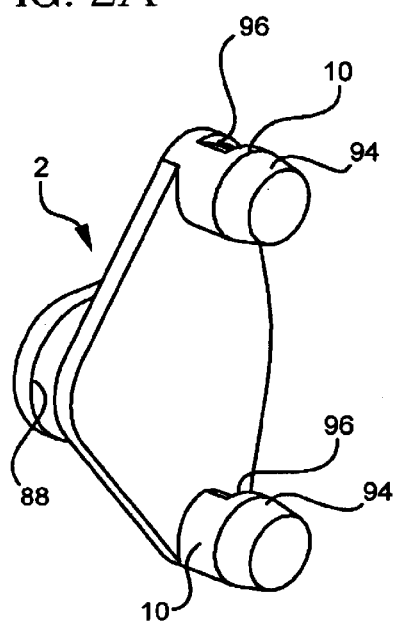
FIG. 2A is rear isometric view of the connector of the present invention shown in FIG. 2.
Figure 2B:
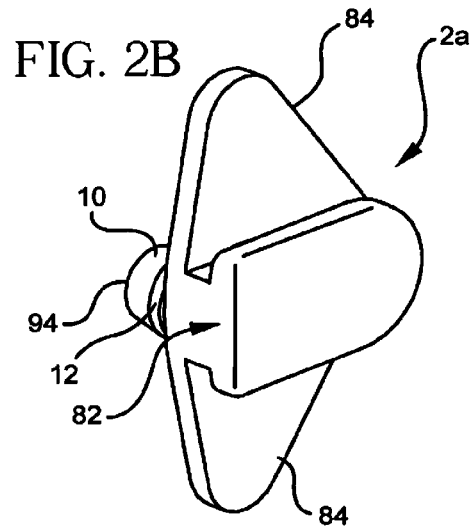
FIG. 2B is a front isometric view of an alternative embodiment of a connector formed in accordance with the present invention.
Figure 2:
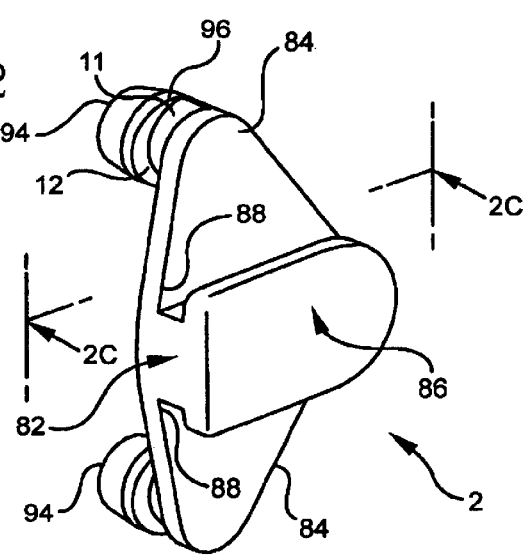
FIG. 2 is a front isometric view of one form of a connector for use with the electronics housing and formed in accordance with the present invention.
Figure 2C:
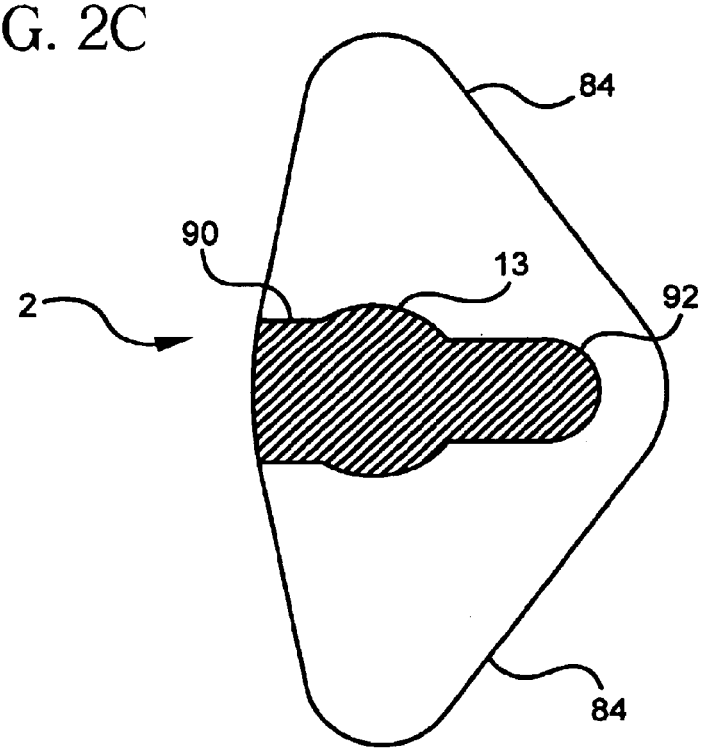
FIG. 2C is a cross-sectional view taken along line 2C—2C of the connector of the present invention shown in FIG. 2.

With reference to FIGS. 2, 2A and 2C, one type of connector 2 (i.e., a passive connector) formed in accordance with the present invention is shown. It includes a main body 82 and two flanges 84 extending outwardly in opposite directions from the main body. The main body 82 is generally T-shaped in the sense that it has a outward portion 86 which overhangs each flange 84 to define a slot 88 therebetween. The slot 88 is defined with a width such that it may closely receive the walls defining the key hole 78 on either lateral side of the electronics housing and to facilitate the alignment and placement of the connector 2, 3 into the key hole. As shown in FIG. 2C, the main body portion 82 of the connector within the slots 88 is shaped with three distinct portions, the first being an enlarged portion 90, the middle being a further enlarged, partially circular or bulbous portion 13, and the third portion being a narrower end portion 92. The narrower and circular portions 92, 13 closely match the dimensions of the end and middle portions 80, 8 of the key holes so that the connector may be closely received by the key holes, thereby preventing rocking or instability, or the inadvertent release of the connector from the key hole.

Extending from the free ends of the flanges 84 on a side opposite to that on which the T-shaped main portion 82 of the connector is located are mounting pins 10. The pins 10 are spaced apart from each other a particular distance which matches the spacing between adjacent holes formed in the back plate of the enclosure (see FIGS. 6, 6A, 6B and 6C). More particularly, each pin 10 of the connector is tapered at its free end 94 (i.e., with a truncated conical shape) to guide the pin into a respective hole in the back plate of the enclosure. Between the tapered free end 94 of the pin and the flange surfaces of the connector is an arcuate slot 96 formed over a portion of the circumference of the pin. More specifically, the slot 96 is defined by an offset camming surface 11, the back surface of each flange 84 and a radially extending shoulder 12 defined by the tapered free end 94 of the pin and the slot 96. The width of the slot 96 is dimensioned so that it may receive therein the portion of the back plate which defines the respective hole in which the pin is inserted when the electronics housing is mounted on the enclosure.

In the embodiments shown in FIGS. 2, 2A and 2C, the passive connectors 2 are provided with two pins 10 separated a predetermined distance apart, each pin being received by a corresponding hole in the back plate of the enclosure. In an alternative embodiment of the passive connector 2a shown in FIG. 2B, a single pin 10 is provided and is centrally located opposite the main T-shaped portion 82 of the connector. It should be noted, however, that flanges 84 are still preferably provided, as in the embodiment shown in FIG. 2, which will reside flush again the surface of the back plate of the enclosure. These flanges 84, as with the flanges shown in the embodiment of FIG. 2, provide stability to the housing when it is mounted on the back plate of the enclosure.

FIGS. 3, 3A and 3B, and FIGS. 4, 4A, 5 and 5A show the preferred form of the active locking connector 3 of the present invention. It should be understood that the active locking connector 3 shown in FIGS. 3, 3A, 3B, 4, 4A, 5 and 5A and the passive connector 2, 2a shown in FIGS. 2, 2A and 2B both lock the electronics housing 1 to the back plate of the enclosure by engaging the edge portions of the back plate which define the holes in which the pins of the connectors are inserted. However, the active locking connector 3 is used by the installer to releasably lock the electronics housing in place by causing the pins of both type of connectors to cam against the edges of the back plate which define the holes in which the pins are inserted, as will be described in greater detail.

The active locking connector 3 basically includes two parts: a pin 100 and a main connector body 102. The pin 100 is inserted into the main connector body 102 and is held in place thereby.

More specifically, the pin 100 includes a tapered (i.e., truncated conical) free end 17 which is used for facilitating the insertion of the pin into the hole in the back plate of the enclosure, and a cylindrical portion 16 which supports the tapered free end. The cylindrical portion 16 is mounted off center (i.e., eccentrically) on an axial side of a larger diameter cylindrical portion 104 of the pin to define an exposed shoulder 18. The larger diameter, middle cylindrical portion 104 leads to an opposite free end cylindrical portion 106 having formed therein diametrically opposed slots 20 in the side walls of the cylindrical portion for receiving a slotted screwdriver, and a hexagonally sided bore 21 formed axially in the opposite free end 106 for receiving an Allen key. Accordingly, the installer may insert either an Allen key or a slotted screwdriver respectively into the bore 21 and slots 20 to turn the pin within the main connector body.

The pin further includes an axially disposed ridge 22 protruding from the surface of the cylindrical free end 106, which ridge acts as an indicating strip for the installer and which indicates whether the pin is turned in an open (unlocked) or locked position.

The pin 100 also includes a beveled surface 108 (preferably at a 30 degree angle), which leads to a narrow, flat, radially protruding and circumferentially extending section 110, which then falls off in a radial flat side 28 that leads to a recessed portion defining a groove 112 formed about the circumference of the pin which, in turn, leads to another angled wall portion 114 (preferably at a 45 degree angle) formed in the surface of the pin. Positioned in the groove 112 and formed on the recessed portion are a pair of diametrically opposed, radially protruding tabs 116 which, as will be described in greater detail, are used to provide resistance to the pin as it turns in the main connector body and further provide a "feel" to the installer of whether the pin is in the fully locked or fully unlocked position.

The eccentrically mounted, small cylindrical portion 16 includes an arcuate camming surface 19 defining a slot 118 which, as will be described in greater detail, engages the edge of a respective back plate hole in which the pin is received when the pin is turned.

The main connector body 102 of the active locking connector has formed in its lateral side walls a recess or slot 24 dimensioned in width in the same manner as the slot 88 formed in the previously described passive connector 2 (FIG. 2) to closely receive the key hole 78 of the electronics housing in which the connector is inserted. In a perpendicular direction to the slot 24 and transversely through the main connector body 102 is formed a bore 120 for captively and rotatably receiving the pin 100. The depth of the slot 24 formed in the top, bottom and curved front side walls of the main connector body is such that that the slot communicates with the bore over portions 27 thereof so that portions 13, 14 of the pin, when mounted in the main connector body, will be exposed. The exposed rounded portions 13, 14 of the pin will engage the enlarged curved portions 8 of the key hole to removeably hold the active locking connector in place on the electronics housing.

As shown in FIGS. 3, 3A, 3B, 5 and 5A, the pin 100 is inserted into the bore 120 of the main connector body 102 and held in place therein. A ridge 25 is formed inside the bore 120 on the interior surface defining the same, and extends radially inwardly in the bore and partially circumferentially about the interior bore surface. The ridge 25 is broken in two diametrically opposed locations 26, and the ridge at such locations has champhered edges, preferably at 45 degree angles, which connect to the interior bore surface. One lateral side of the inner ridge 25 is cut to form a 90° wall or shoulder 122 with respect to the interior bore surface, and the other lateral side of the ridge is formed with a sloping (preferably at 45 degrees) beveled surface 124. As may be seen from FIG. 3B, the pin 100 is inserted into the main connector body 102 so that the inner ridge 25 of the main connector body rides up and passes over the beveled side 108 of the pin ridge until the inner ridge 25 of the main connector body is seated in the groove 112 formed on the pin surface. The 90° shoulder 122 of the inner ridge of the connector body engages the flat side 28 of the pin ridge, while the beveled surfaces 114, 124 of the pin and inner ridge engage each other. The pin is thereby held in place within the bore of the main connector portion, but is free to turn. The projections 116 formed in the recessed portion of the pin ride up over the champhered edges of the inner ridge 25 and engage the exposed ridge surface when the pin is rotated within the main connector body. The projections 116 provide additional resistance between the pin and the main connector body so that the pin does not rotate inadvertently within the main connector portion, and also the installer may feel when the pin is rotated within the main connector body to a locked or unlocked position when the projections 116 are aligned with the openings 26 formed in the inner ridge.

Figure 3:
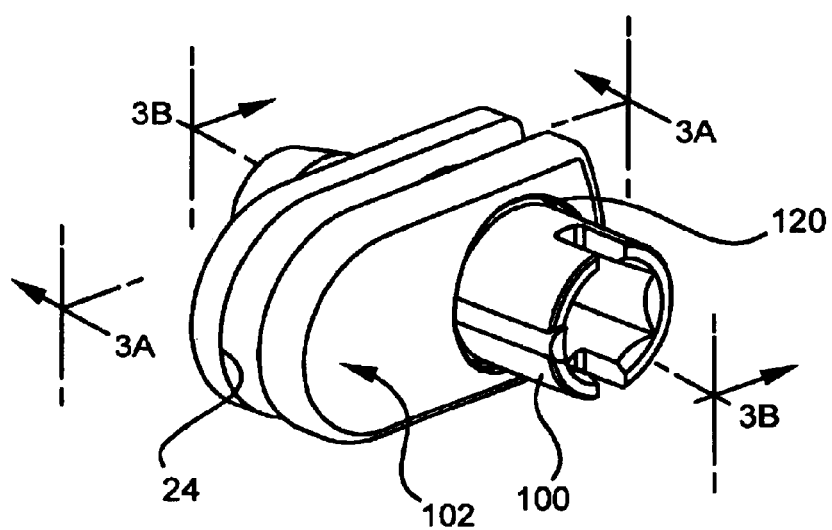
FIG. 3 is a front isometric view of a locking connector for use with the electronics housing and formed in accordance with the present invention.
Figure 3A:
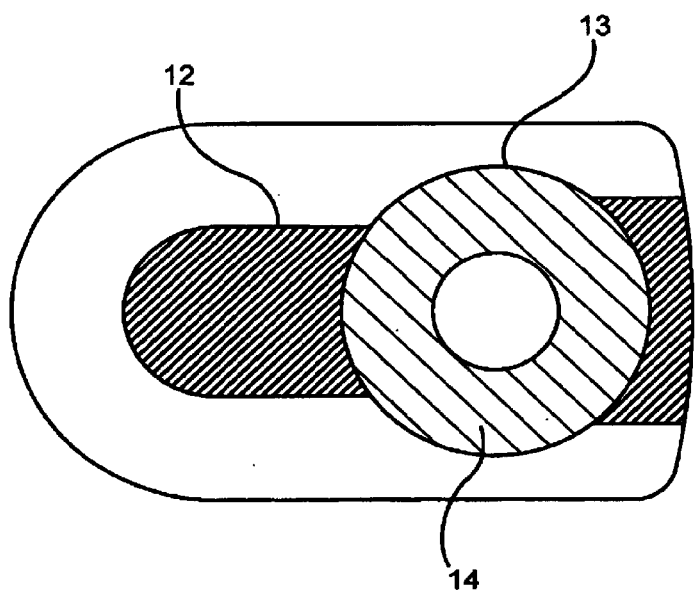
FIG. 3A is a cross-sectional view taken along line 3A—3A of the locking connector shown in FIG. 3.
Figure 3B:
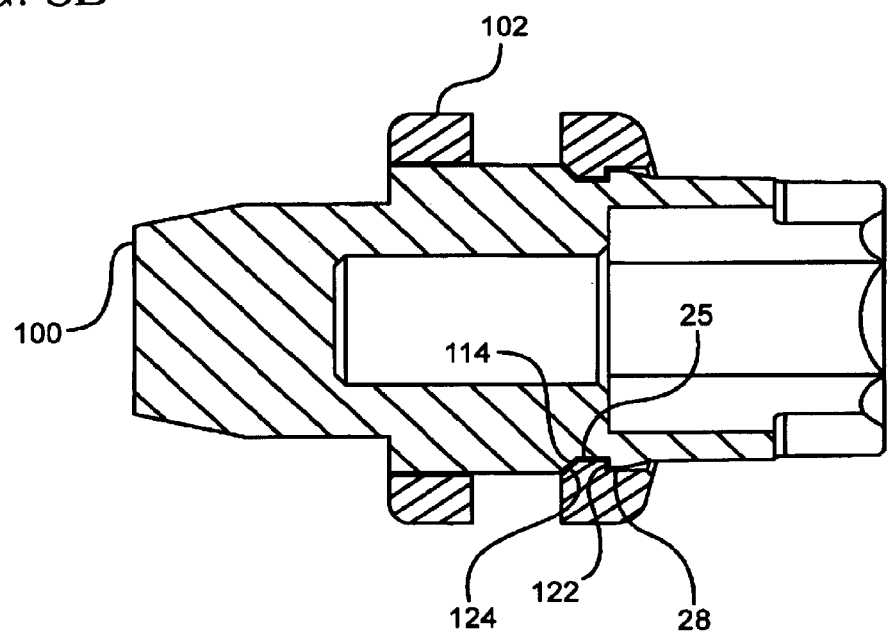
FIG. 3B is a cross-sectional view taken along line 3B—3B of the locking connector of the present invention shown in FIG. 3.
Figure 4:
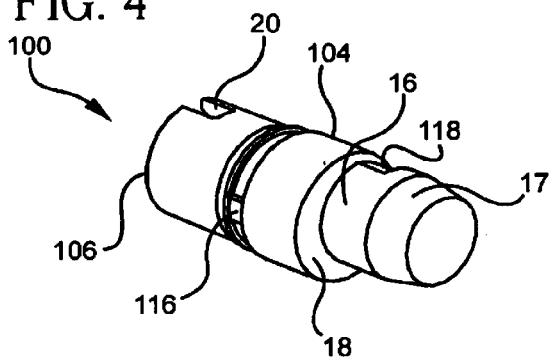
FIG. 4 is a rear isometric view of a portion of the locking connector of the present invention shown in FIG. 3.
Figure 4A:
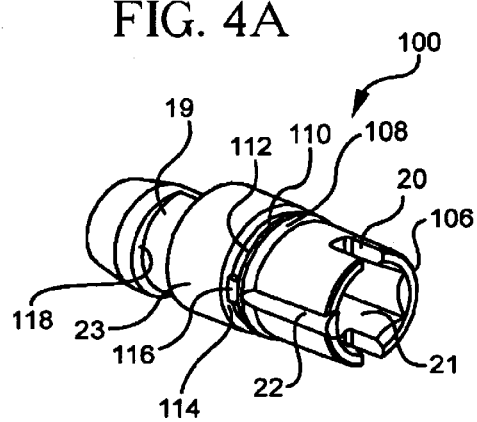
FIG. 4A is a front isometric view of the connector portion shown in FIG. 4.
Figure 5:
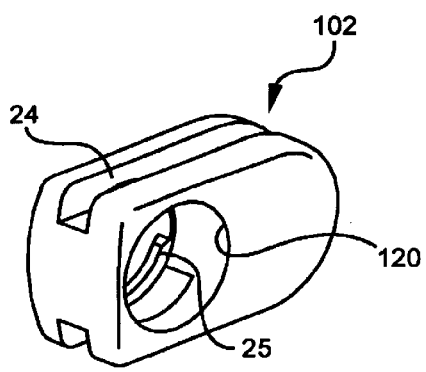
FIG. 5 is a rear isometric view of another portion of the connector of the present invention shown in FIG. 3.
Figure 5A:
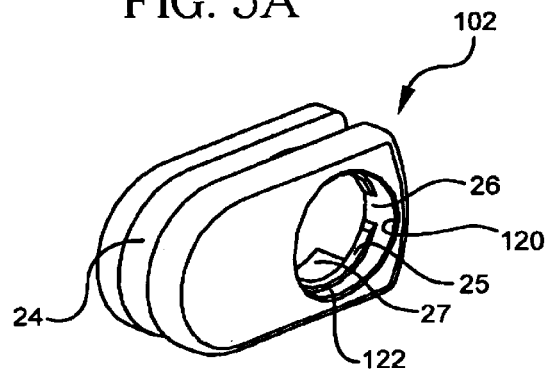
FIG. 5A is a front isometric view of the connector portion shown in FIG. 5.

As can be seen from FIG. 3A, portions of the pin 13, 14 are exposed within the slot 24 formed within the main connector body, which exposed portions are resiliently and closely received by the enlarged portion 8 of the key hole 4 formed in the electronics housing to hold the connector in place on the electronics housing until it is forcibly removed by the installer.

Figure 6:
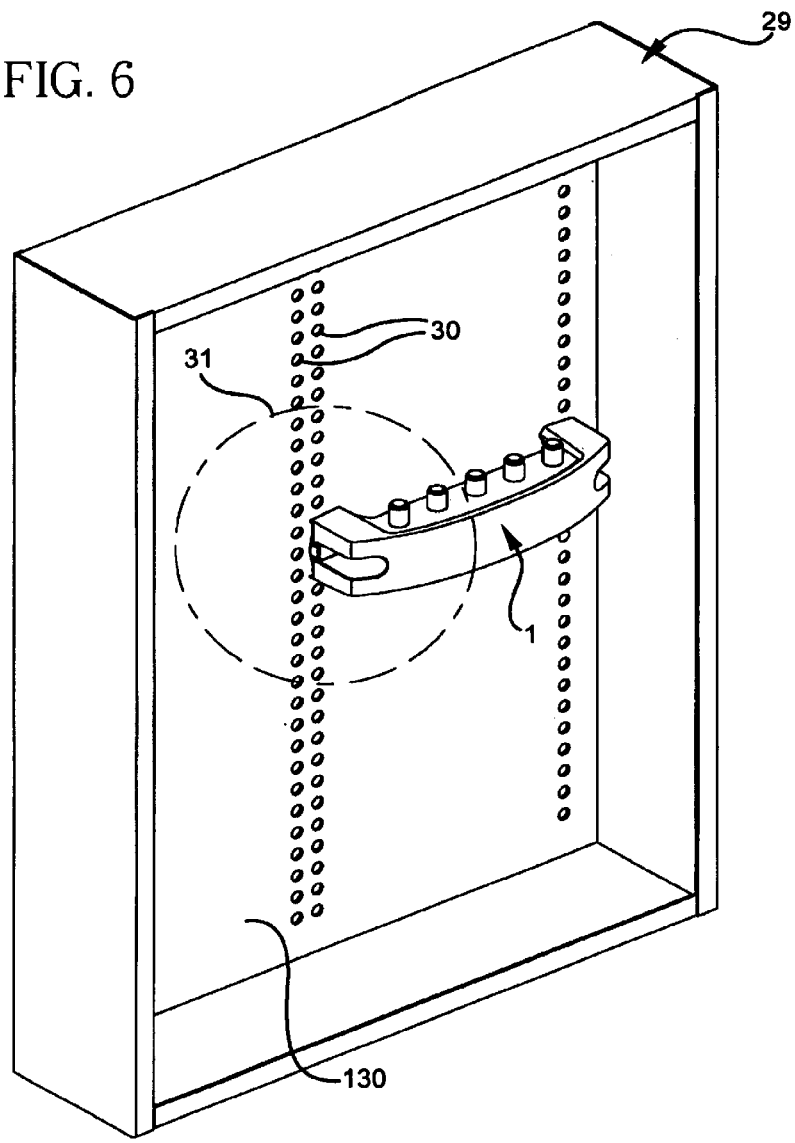
FIG. 6 is a front isometric view of an electronics enclosure and showing the electronics housing of the present invention attached thereto.

FIGS. 6, 6A, 6B and 6C show the adaptability of the electronics housing 1 of the present invention, with its associated connectors, and how such may be mounted in various conventional enclosures 29 having different hole configurations in their back plates 130. In FIG. 6, the electronics housing is mounted to an enclosure 29 which has central parallel columns of holes 30 which are not offset from each other. Either a dual pin connector 2, such as shown in FIG. 2A, or a single pin connector 2a, such as shown in FIG. 2B, may be used in such an enclosure.

Figure 6A:
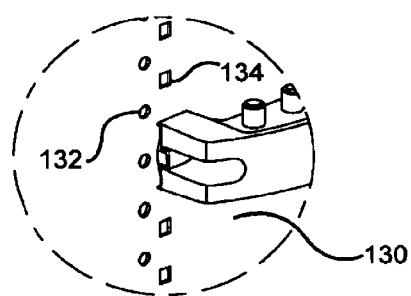
FIGS. 6A, 6B and 6C are detailed, partial isometric views of the back plate of the enclosure shown in FIG. 6 with different openings formed in the back plate than those shown in the enclosure depicted in FIG. 6 and demonstrating the attachment of the electronics housing of the present invention to the back plate of the enclosure.

FIG. 6A shows a portion of the back plate 130 of another type of conventional enclosure in which the holes 132, 134 in parallel columns are offset from one another. Note also that in this type of conventional enclosure, the holes 130 of one column are circular, and the holes 132 of the other column are square. In this arrangement, the two pin connector 2, which provides such an offset, may be used for properly aligning the electronics housing within the enclosure 29 so that it may be mounted therein horizontally to the enclosure. Also, the structure of the pins 9 of the connector, as previously described, allows the pins to be received by both circular and square holes in the back plate 130 of the enclosure and, with the camming action which they provide, allows the pins to securely engage the edges of the back plate which define the holes in which the pins are inserted.

Figure 6B:
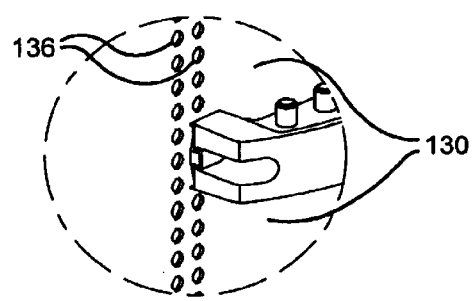
Figure 6C:
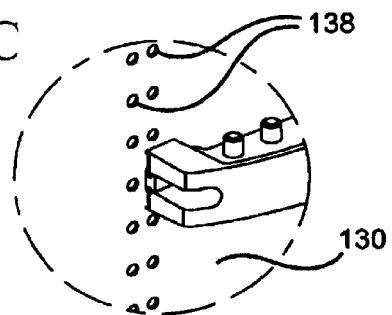

FIGS. 6B and 6C show other arrangements of holes in conventional enclosure back plates, where the spacing may be different but which provide no offset or staggering in the parallel columns of holes (the back plate holes 136 shown in FIG. 6B are slightly elongated with upper and lower notches, while the holes 138 in FIG. 6C are spaced apart a greater distance but are perfectly circular). A two pin connector 2, such as shown in FIG. 2, may be used for the holes shown in FIG. 6B, and a single pin, non-offset connector 2a, such as shown in FIG. 2B, may be used for back plate holes shown in FIG. 6C.

Figure 7:
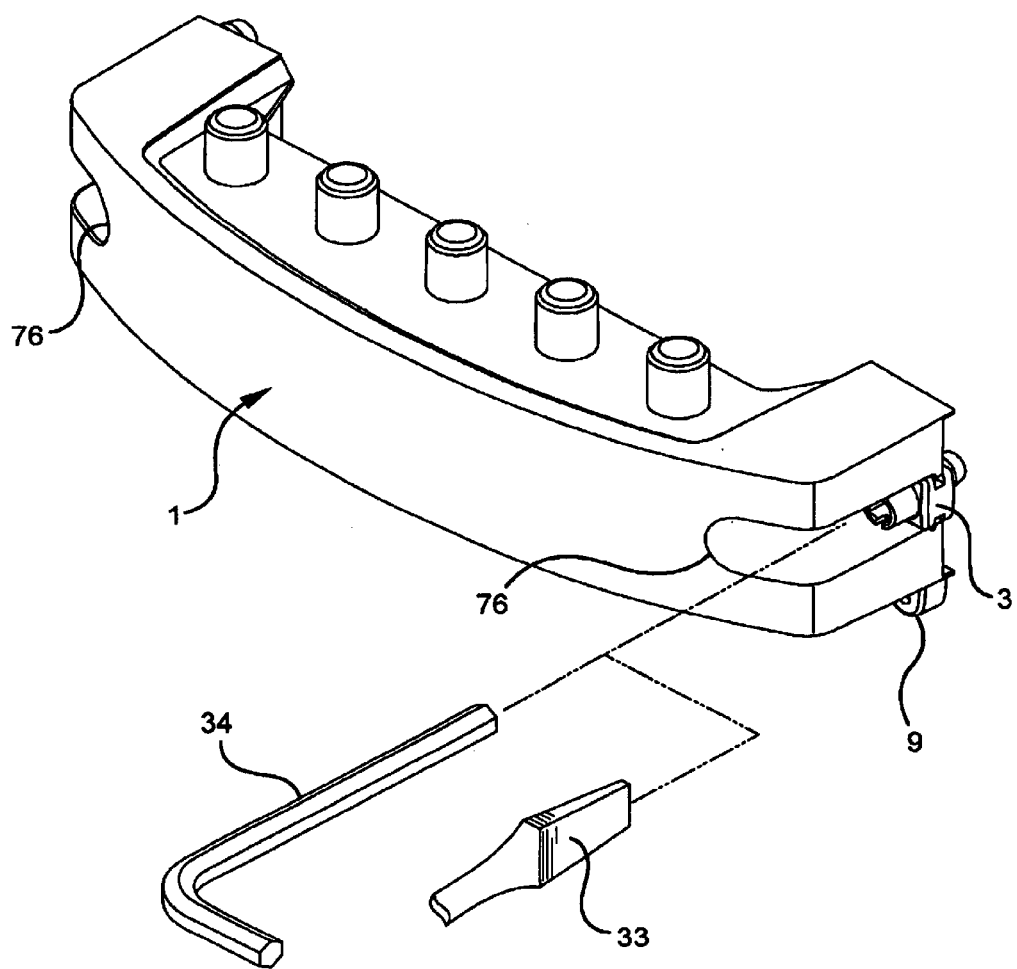
FIG. 7 is an isometric view of an electronics housing formed in accordance with the present invention and demonstrating the various tools which may be used to lock the housing in place in the enclosure.

FIG. 7 illustrates the ease with which an installer may attach the electronics housing 1 of the present invention to a cable distribution enclosure. The installer may use a slotted screwdriver 33 or Allen key 34 to secure the electronics housing in the enclosure. The end of the Allen key or screwdriver is passed through the open pocket 76 on either side of the electronics housing and is fitted either into the hexagonal opening 21 or the diametrically opposed slots 20 formed in the head of the pin of the active locking connector 3. The pin is then turned so that the camming surface 19 on the pin engages the edge of the back plate which defines the particular hole into which the pin is inserted, thereby locking the electronics housing in place on the back plate 130. The indicating strip ridge 22 formed axially on the surface of the head of the pin is viewable by the installer through the open pocket 76, and indicates the rotational position of the pin and, accordingly, whether the electronics housing is locked in place in the enclosure, or is in an unlocked state for easy removal therefrom. In FIG. 7, the ground screw connection 9 is also visible which, as mentioned previously, is provided for connection to an independent grounding wire.

Figure 8:
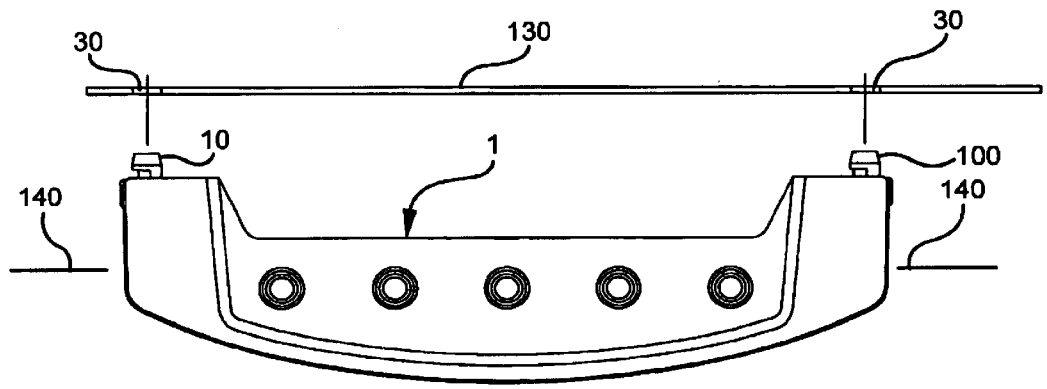
FIGS. 8, 9 and 10 are sequential top views of an electronics housing formed in accordance with the present invention shown in relation to the back plate of an enclosure and demonstrating the method for attaching the electronics housing to the back plate.
Figure 9:
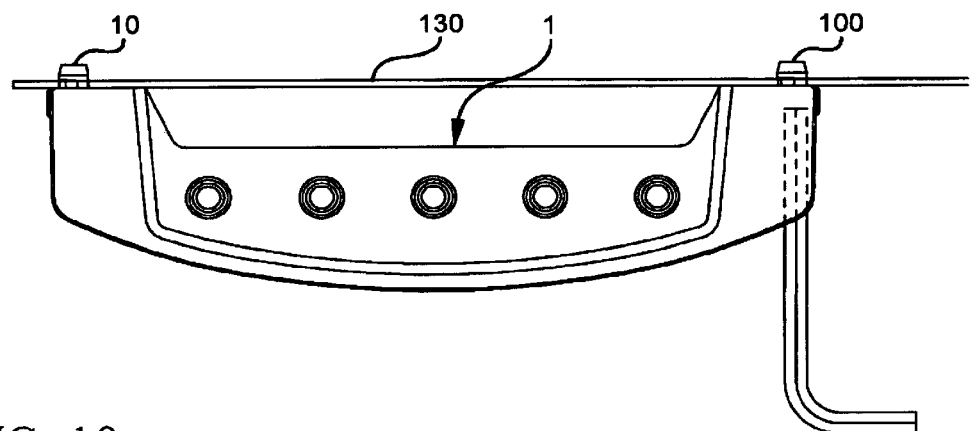
Figure 10:
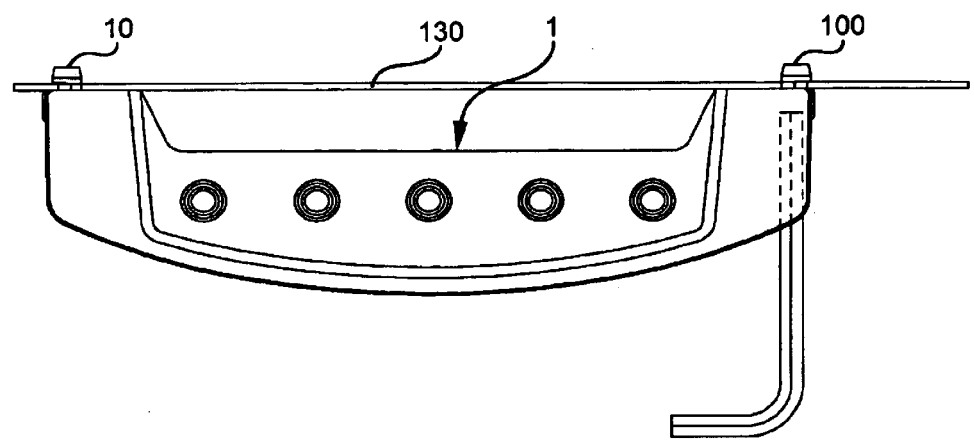

FIGS. 8, 9 and 10 show the sequence and methodology of installing the electronics housing 1 of the present invention onto the back plate 130 of an enclosure.

The electronics housing of the present invention is positioned so that its general longitudinal axis 140 is parallel with the plane in which the back plate resides, and with the pins 10, 100 of the connectors mounted on each lateral side of the electronics housing aligned with the holes in the back plate and perpendicular to the back plate plane. The active locking connector 3 is shown on the right side of the electronics housing when viewing FIGS. 8–10, and it should be noted that the pin 100, and in particular, the camming surface 19 thereof, is positioned inwardly of the electronics housing.

The installer moves the electronics housing towards the back plate 130, keeping the electronics housing parallel to the back plate and with the pins 10, 100 in alignment with the holes 30 in the back plate, until the pins of the connectors pass through their respective holes. The tapered free ends 17, 94 of the pins of each connector facilitates their insertion into the holes of the back plate. Note that the camming surface 11 of the non-moving pin 10 of the left connector (when viewing FIGS. 8–10) is facing outwardly from the center of the electronics housing as it passes through an aligned back plate hole of the enclosure. The installer then inserts an Allen key 34, as shown in FIG. 9, or a slotted screwdriver 33, into the head of the pin 100 of the active locking connector 3, and turns the pin 180° so that the camming surface 19 of the pin engages the edge of the back plate which defines the respective hole in which the pin is inserted.

As shown in FIG. 10, the camming surface 19 of the pin of the active locking connector 3 is now in a 180° rotated position from where it was in FIGS. 8 and 9, so that the camming surface engages the edge of the back plate defining the respective hole in which the pin is inserted. This camming action further causes the electronics housing 1 to move slightly laterally on the back plate 130 and forces the camming surface 11 of the non-rotatable pin 10 of the left connector against the back plate edge defining the hole in which the left connector pin is inserted. Accordingly, both pins 10, 100 engage the edges of the holes and secure the electronics housing in place on the back plate of the enclosure.

To remove the electronics housing 1 from the back plate 130, the installer simply rotates the pin 100 of the active locking connector 3 in the opposite direction (the indicating strip 22 which may be viewed through the open pocket 76 of the housing will indicate to the installer whether the pin is in the locked or unlocked position). This will free each pin of the left and right connectors from its engagement with its respective hole edge, and allows the electronics housing to be removed from the back plate 130 by the installer pulling on the electronics housing outwardly and perpendicularly from the enclosure back plate.

FIG. 11 further illustrates the adaptability of the electronics housing of the present invention. As mentioned previously, various types of connectors (passive single pin, double pin or active locking connectors) may be used by the installer, depending upon the type of enclosure in which the electronics housing is to be mounted. However, the electronics housing of the present invention may be mounted on any flat surface, and need not be mounted in a pre-drilled conventional, cable distribution enclosure. The narrow, elongated slots 80 of the key holes 78 in the electronics housing are provided to accept a standard screw 32 which may be inserted through the open pocket 76 in the lateral sides of the housing and into the key hole 78, and screwed into the support surface on which the electronics housing is to be mounted so as to hold the electronics housing in place. If screws 32 are desired to be used, the connectors 2, 3 are not inserted into the key hole slots. Accordingly, the electronics housing of the present invention is adaptable for not only use with conventional cable distribution enclosures 29, but also may be mounted on any surface with screws or other types of fasteners.

Figure 12:
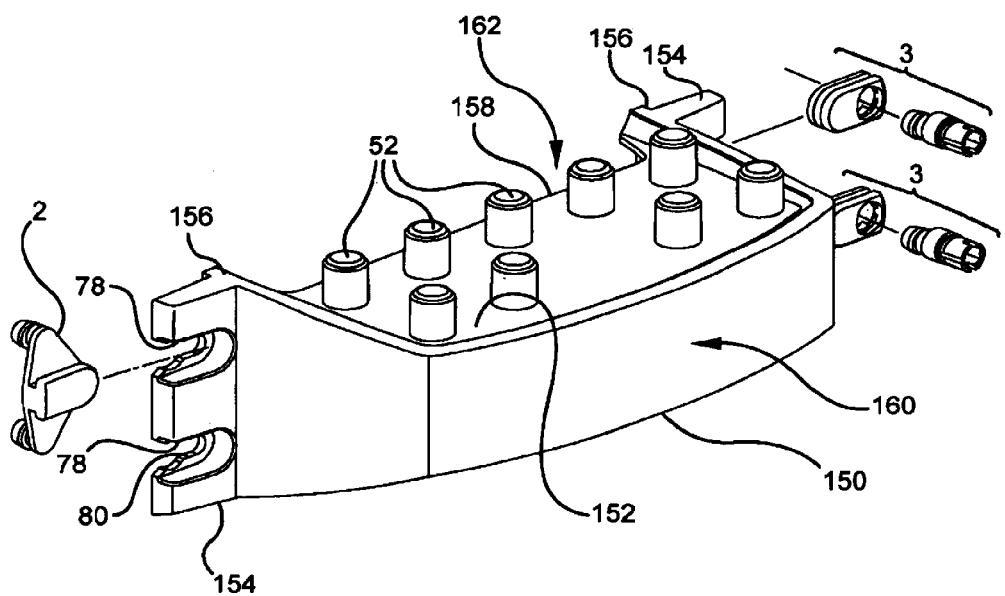
FIG. 12 is a front isometric view of another embodiment of an electronics housing formed in accordance with the present invention and associated connectors for attaching the electronics housing to an enclosure.

FIG. 12 illustrates another form of the electronics housing 150 of the present invention. The electronics housing 150 in the illustrated drawing is for an eight-way splitter, and includes 9 coaxial connectors 52 extending from the upper surface 152 of the housing. One connector 52 is used for providing an electronic signal to the splitter enclosed in the housing, and the other eight connectors 52 are output connectors for distributing the split electronic signal to various rooms or apartments in the dwelling in which the electronics housing is mounted.

In the embodiment shown in FIG. 12, the housing 150 may include more than one key hole or slot 78 formed on each side of the housing. In this particular embodiment, there are four key holes 78 provided. As illustrated, non-rotating pin (passive) connectors 2, such as shown in FIGS. 2 and 2B, and one or more rotating pin (active locking) connectors 3, such as shown in FIG. 3, may be employed on either side of the electronics housing. Rotating pin and non-rotating pin connectors may be positioned on the same side of the housing or, if desired, the housing may be secured to the enclosure using all rotating pin, active locking connectors. Again, in the embodiment shown in FIG. 12, the key holes 78 are formed with elongated slots 80 to accept screws or other conventional fastening devices to mount the electronics housing 150 directly to a flat surface, and not necessarily requiring the electronics housing to be mounted in a conventional cable distribution enclosure 29. It should be further noted in the embodiment shown in FIG. 12 that the key holes are formed in oppositely disposed flanges 154 extending outwardly from each lateral side of the housing, and such key holes are easily accessible by the installer and his using either a screwdriver or Allen key to mount the electronics housing to a desired mounting surface. It should be further noted that the lateral sides 156 of the housing extend beyond the rear surface 158 of the main housing body 160 to form a channel 162 through which the coaxial cables and other wires may be passed and held captive in place between the electronics housing and the mounting surface or back plate of the enclosure when the electronics housing is mounted on such.

FIGS. 13, 14A, 14B and 15 illustrate another form of the electronics housing 200 of the present invention. The electronics housing 200 in the illustrated drawings is for a 5×16 way splitter. Preferably at a top beveled or angled (preferably at 45 degrees) surface 202 of the front portion of the housing are situated 5 coaxial input connectors 204 for receiving a set of two input signals (A and B), controlled at the conventional 13 volts and 18 volts, from one satellite receiver, a second set of two input signals (A and B), also controlled by 13 volts and 18 volts, from a second satellite receiver, and an "off air" antenna input signals. The signals are split and distributed among 16 output coaxial connectors 206.

Preferably, and as shown in FIGS. 13, 14A, 14B and 15, the 16 output coaxial connectors 206 are arranged in 4 descending rows, parallel to one another, with 4 connectors 206 on each row. Preferably, the front portion of the housing is formed with a recessed stepped, or serpentine, series of sequential ledges 208 and supporting walls 210. Preferably, the ledges 208 are angled at a 45 degrees from the front surface of the electronics housing 200, with all the ledges 208 and supporting walls 210 being recessed from the front surface so they do not extend beyond the front surface of the electronics housing. The preferred angle of 45 degrees for the ledges allows the 16 output coaxial connectors 206 to be mounted at a corresponding angle on the ledges 208. This facilitates the connection of individual coaxial cables 212 onto the output coaxial connectors 206 and the input coaxial connectors 204, and further facilitates the routing of the coaxial cables 212 from the signal distribution enclosure to various rooms or apartments in the dwelling in which the electronics housing is mounted.

The electronics housing 200 further preferably includes a pair of arms 214 extending outwardly from the front surface of the housing 200 to define with the front surface of the housing a pair of channels through which the coaxial cables 212 may be routed. The arms hold the coaxial cables 212 in place when the cables 212 are coupled to respective output coaxial connectors 206.

Figure 13:
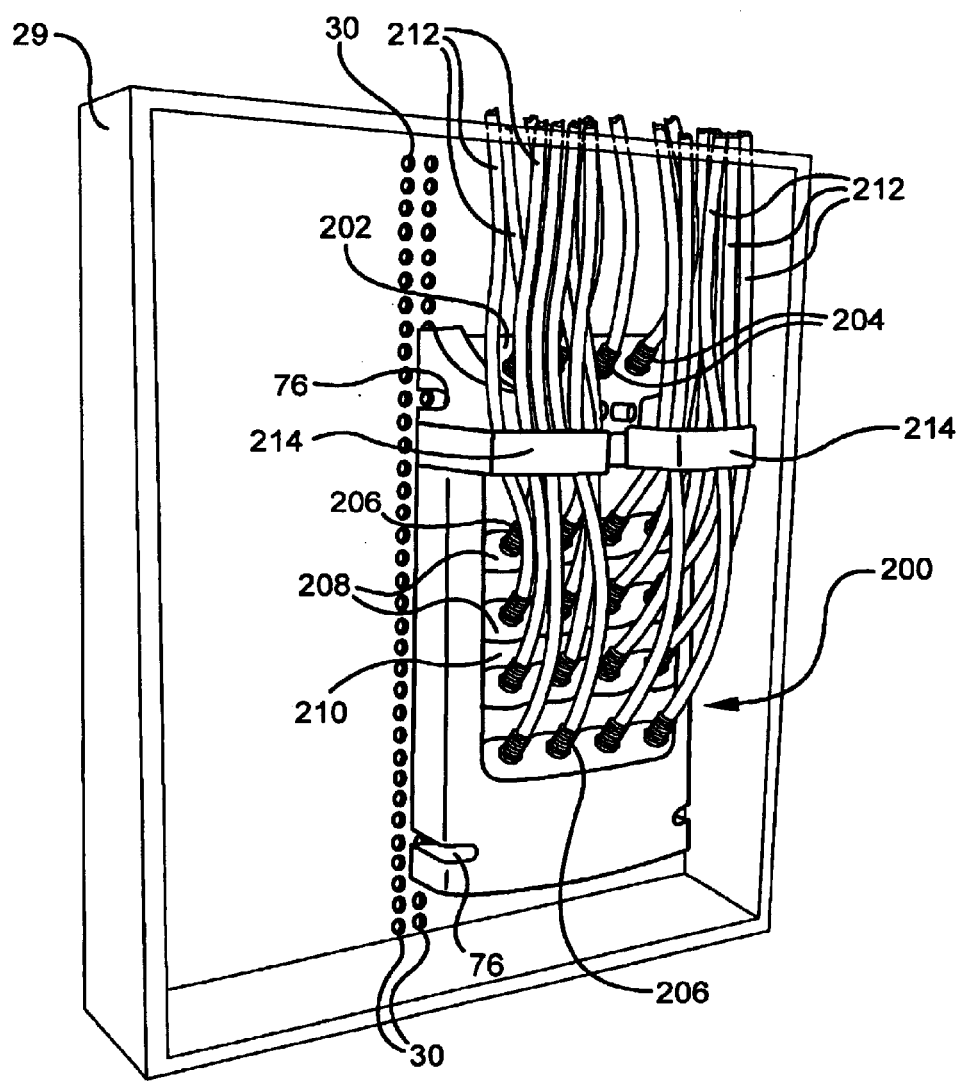
FIG. 13 is a front isometric view of another embodiment of an electronics housing formed in accordance with the present invention and showing the connection of a plurality of coaxial cables thereto and the routing of the same.
Figure 16:
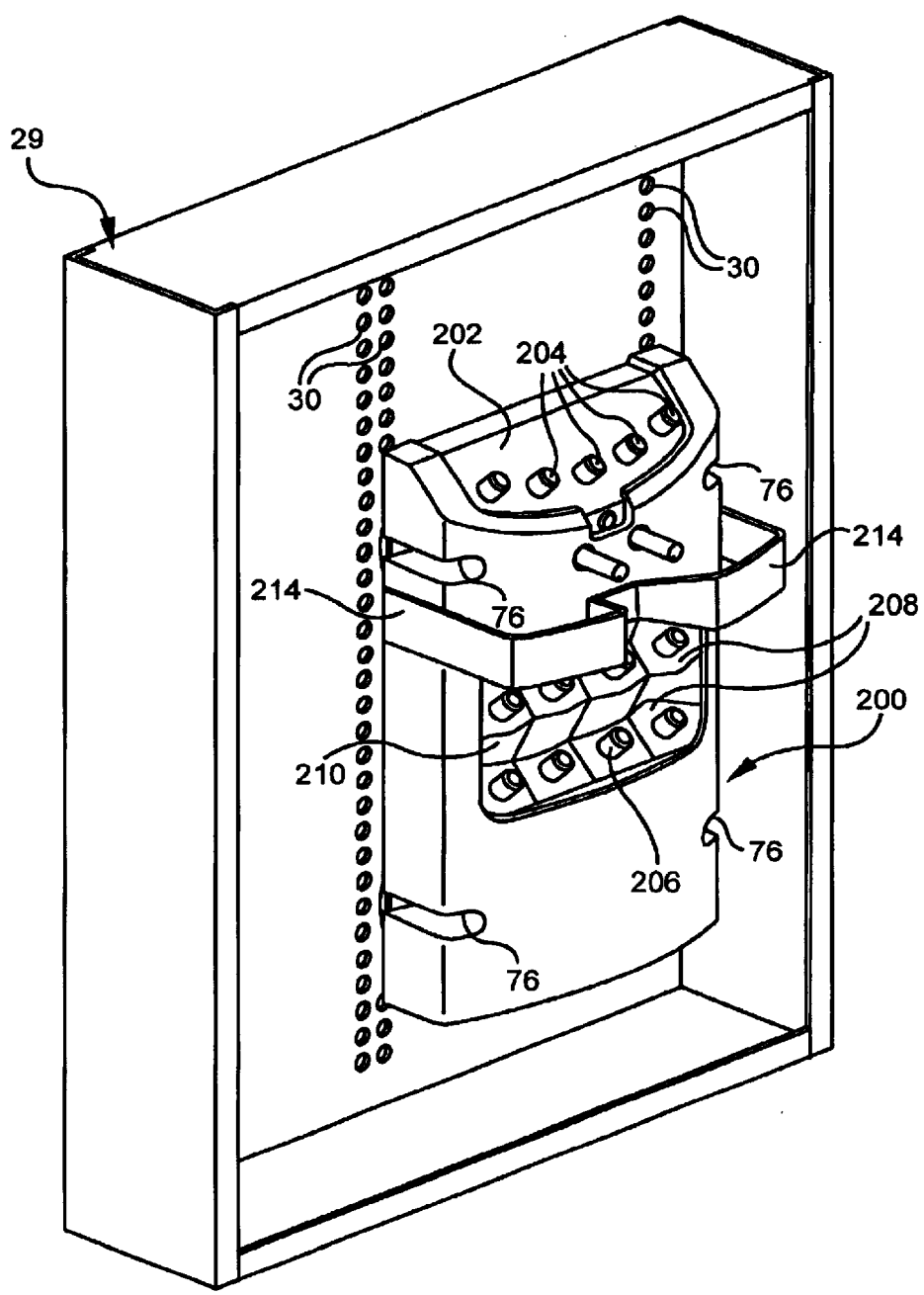
FIG. 16 is a front isometric view of another embodiment of an electronics housing formed in accordance with the present invention and similar in many respects to that shown in FIGS. 13 and 15.

FIG. 14A shows an extended (i.e., longer) version of the electronics housing shown in FIG. 13, which is also shown in FIG. 14B. The preferred length of the housing is either 13 inches, as shown in FIGS. 13 and 14B, or 16 inches, as shown in FIG. 14A. FIG. 14B shows holes 216 formed through the thickness of the front portion of the housing to receive the output coaxial connectors 206. Holes 218 are also formed in the beveled (preferably at a 45 degree angle also) top surface 202 of the electronics housing to receive the input coaxial connectors 204. FIG. 14A shows the extended version of the electronics housing 200 prior to the formation of the holes 216. It should be noted that in the extended version shown in FIG. 14a, the supporting walls 210 are sufficiently long enough to allow labels 220 to be added to the supporting walls just below and adjacent to the corresponding ledges 208 so that each output coaxial connector 206 may include a designation printed on the label 220 which will facilitate the connection of the proper coaxial cable 212 to its corresponding connector 206.

Although a 5×16 splitter has been described, it is envisioned to form electronics housing 200 with similar structure for functioning as a 3×16, 3×8 or 5×8 splitter.

Figure 15:
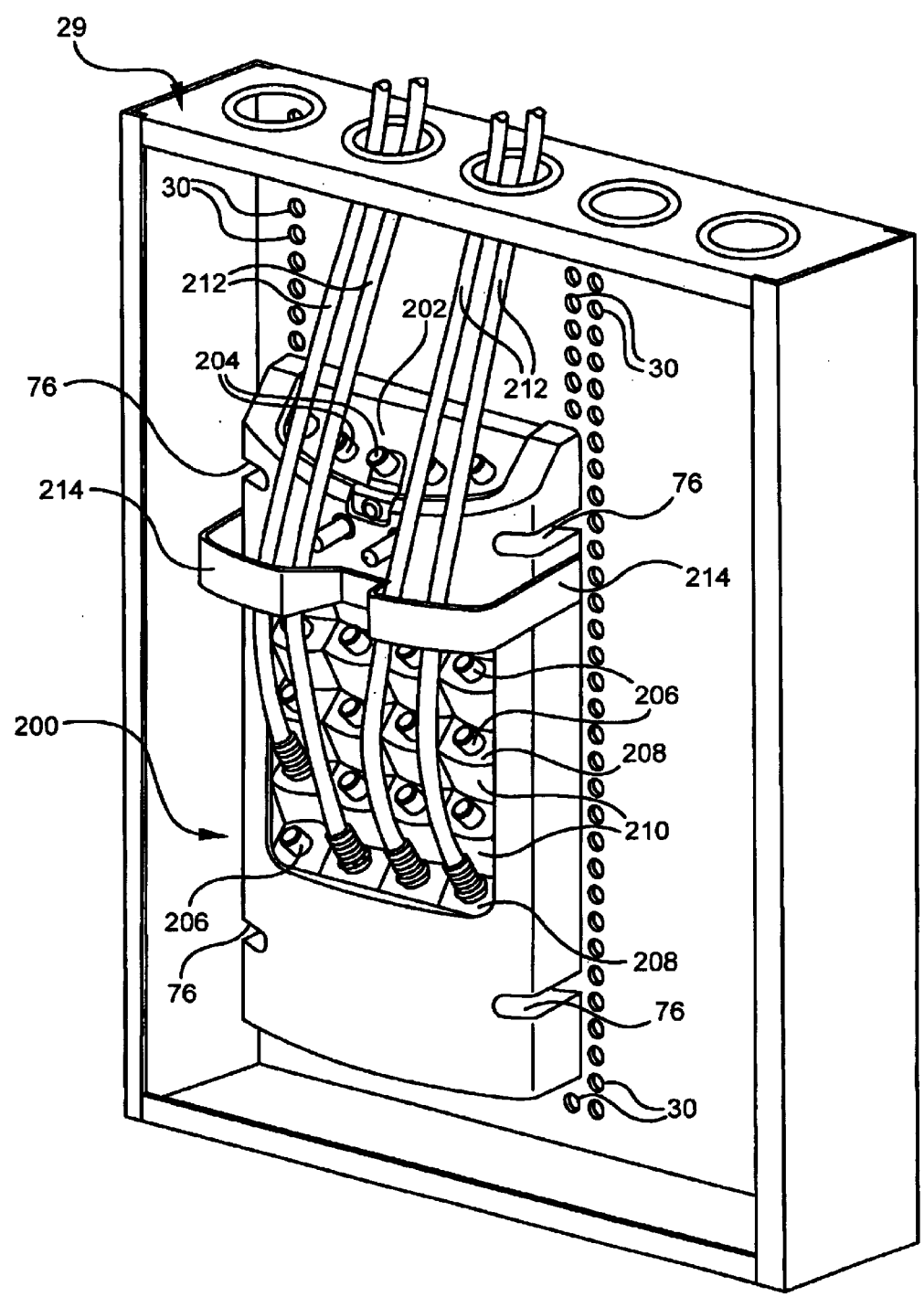
FIG. 15 is a front isometric view of the electronics housing of the present invention shown in FIG. 13, viewed from a different angle and with fewer electrical coaxial cables attached thereto so as not to obscure the front face thereof.

The width of the electronics housing 200 shown in FIGS. 13, 14A, 14B and 15 is preferably 6¼ inches so that the electronics housing, like the previously described electronics housings, may be received in corresponding holes 30 of the distribution enclosure 29, as shown in FIGS. 13 and 15. The 45 degree angle of the ledges 208, and having the ledges 208 recessed on the front surface of the electronics housing 200, and the inclusion of arms 214, facilitate the routing of the cables 212 and connection of the cables to the corresponding coaxial connectors 204, 206, and further allows the cables 212 to be connected to the housing at an angle such that the cables would not extend so significantly in front of the housing as to interfere with the cover of the enclosure 29 being closed.

It should be further noted that the electronics housing shown in FIGS. 13, 14A, 14B and 15 have slots and open pockets 76 formed in the lateral sides thereof, such as those formed in the housings described previously herein, to receive connectors 2, 3 for mounting the electronics housing to the enclosure 29 in the same manner as the previously described housings are mounted. It should be further noted that the electronics housing 200 may be mounted as shown in FIGS. 13 and 15, with the coaxial cables 212 being routed towards the top of the figure, or may be mounted in the enclosure 29 upside-down, so that the coaxial cables 212 may be routed downwardly when viewing FIGS. 13 and 15.

FIG. 16 illustrates a 5×8 splitter, as mentioned previously, using the electronics housing 200 of the present invention. The structure of this splitter and the electronics housing therefor is similar in many respects to the 5×16 splitter and electronics housing therefor described previously and shown in FIGS. 13, 14A, 14B and 15. Parts, components and structure used in the 5×8 splitter and housing shown in FIG. 16 which are similar to those used in the 5×16 splitter and housing shown in FIGS. 13, 14A, 14B and 15 are referred to by the same reference numbers and the structure and functionality of these components described previously in relation to the 5×16 splitter are incorporated herein by reference with respect to the 5×8 splitter.

Although illustrative embodiments of the present invention have been described herein with reference to the accompanying drawings, it is to be understood that the invention is not limited to those precise embodiments and that various other changes may be effected herein by one skilled in the art without departing from the scope or spirit of the invention.

What is claimed is:

1. A signal management (SM) electronics housing, which comprises:

a housing structure which defines an enclosure for containing therein electronic circuitry, the housing structure being mountable on a supporting structure, the housing structure having at least two opposite walls, each of the at least two opposite walls having formed therein at least one open slot; and a plurality of connectors, each connector of the plurality of connectors being receivable in a corresponding one of the open slots, the connectors being attachable to the supporting structure to selectively secure the electronics housing thereto;

wherein at least one of the connectors of the plurality of connectors is a locking connector, the locking connector being selectively configurable in a first configuration, wherein the locking connector allows the electronics housing to be selectively mounted to and unmounted from the supporting structure, and a second configuration, wherein the locking connector secures the electronics housing to the supporting structure; and wherein the locking connector includes a main connector body, and a pin extending from and rotatably mounted on the main connector body, the pin including a camming surface, the pin being received in an opening formed in the supporting structure when the electronics housing is mounted thereon, the pin being selectively rotatable such that the camming surface thereof engages an edge of the supporting structure defining the opening to secure the electronics housing to the supporting structure.

2. A signal management (SM) electronics housing as defined by claim 1, wherein the main connector body of the locking connector includes a pair of lateral side walls, each of the side walls of the pair of lateral side walls having a slot formed therein, the slot of each of the side walls of the main connector body receiving a portion of the wall of the at least two opposite walls when the locking connector is received by a respective open slot formed in the wall of the at least two opposite walls of the housing structure, the main connector body further having a bore formed through the thickness thereof, the bore receiving the rotatable pin.

3. A signal management (SM) electronics housing as defined by claim 2, wherein one of the rotatable pin and the main connector body of the locking connector includes a ridge, and the other of the rotatable pin and the main connector body of the locking connector has formed in a surface thereof a groove; and wherein the ridge is slidably seated in the groove so that the rotatable pin is mounted captively to the main connector body of the locking connector but rotatable with respect thereto.

4. A signal management (SM) electronics housing as defined by claim 2, wherein the main connector body includes a ridge formed on an interior surface defining the bore thereof and extends radially inwardly in the bore and partially circumferentially about the interior bore surface, the ridge being broken in at least two diametrically opposed locations, the ridge having camphered edges at the at least two diametrically opposed locations; and wherein the rotatable pin having formed circumferentially on a surface thereof a groove from which extends at least a pair of diametrically opposed, radially protruding tabs, the ridge of the main connector body being slidably received by the groove of the rotatable pin of the locking connector to captively mount the rotatable pin to the main connector body of the locking connector, the at least two diametrically opposed tabs riding up over the camphered edges of the ridge when the rotatable pin is rotated relative to the main connector body to provide additional resistance between the pin and the main connector body and to prevent the pin from rotating inadvertently within the main connector body.

5. A signal management (SM) electronics housing, which comprises:
   a housing structure which defines an enclosure for containing therein electronic circuitry, the housing structure being mountable on a supporting structure, the housing structure having at least two opposite walls, each of the at least two opposite walls having formed therein at least one open slot; and
   a plurality of connectors, each connector of the plurality of connectors being receivable in a corresponding one of the open slots, the connectors being attachable to the supporting structure to selectively secure the electronics housing thereto;
   wherein at least one of the connectors of the plurality of connectors is a locking connector, and wherein at least another of the connectors of the plurality of connectors is a passive connector, the locking connector being received in a respective open slot formed in one wall of the at least two opposite walls, and the passive connector being received in a respective open slot formed in another wall of the at least two opposite walls, the locking connector including a main connector body and a pin extending from and rotatably mounted on the main connector body, the pin including a camming surface, the pin being received in a first opening formed in the supporting structure when the electronics housing is mounted thereon, the passive connector including a main connector body and at least one pin extending from and non-rotatably mounted on the main connector body thereof, the at least one non-rotatable pin including a camming surface, the at least one non-rotatable pin of the passive connector being received in a second opening formed in the supporting structure when the electronics housing is mounted thereon, the pin of the locking connector being selectively rotatable such that the camming surface thereof engages an edge of the supporting structure defining the first opening and causing the camming surface of the at least one non-rotatable pin of the passive connector to engage an edge of the supporting structure defining the second opening to secure the electronics housing to the supporting structure.

6. A signal management (SM) electronics housing, which comprises:
   a housing structure which defines an enclosure for containing therein electronic circuitry, the housing structure being mountable on a supporting structure, the housing structure having at least two opposite walls, each of the at least two opposite walls having formed therein at least one open slot; and
   a plurality of connectors, each connector of the plurality of connectors being receivable in a corresponding one of the open slots, the connectors being attachable to the supporting structure to selectively secure the electronics housing thereto;
   wherein at least one of the connectors of the plurality of connectors is a passive connector, the passive connector including a main connector body and at least two flanges extending outwardly in opposite directions from the main connector body, and a pair of spaced apart pins, one pin of the pair of pins being mounted on and extending from one flange of the at least two flanges, and the other pin of the pair of pins being mounted on and extending from the other flange of the at least two flanges, each pin of the pair of pins having a slot formed over a portion of the circumference thereof, each slot defining a camming surface, the passive connector being selectively received in one of the open slots of the housing structure, each pin of the pair of pins being received in a respective opening formed in the supporting structure when the electronics housing is mounted thereon, the camming surface of each pin engaging an edge of the supporting structure defining the respective opening in which the pin is received to secure the electronics housing to the supporting structure.

7. A signal management (SM) electronics housing as defined by claim 6, wherein the main connector body of the passive connector is generally T-shaped and includes an outward portion which overhangs each flange to define a slot therebetween, each slot receiving a portion of one wall of the at least two opposite walls when the passive connector is received by the open slot of the one wall of the at least two opposite walls.

8. A signal management (SM) electronics housing, which comprises:
   a housing structure which defines an enclosure for containing therein electronic circuitry, the housing structure being mountable on a supporting structure, the housing structure having at least two opposite walls, each of the at least two opposite walls having formed therein at least one open slot; and
   a plurality of connectors, each connector of the plurality of connectors being receivable in a corresponding one of the open slots, the connectors being attachable to the supporting structure to selectively secure the electronics housing thereto;
   wherein at least one of the connectors of the plurality of connectors is a passive connector, the passive connector having a main connector body, at least two flanges extending in opposite directions from the main connector body, and a pin centrally located on the main connector body and extending therefrom, the passive connector being selectively received in one of the open slots of the housing structure, the pin being received in an opening formed in the supporting structure when the electronics housing is mounted thereon, each flange of the at least two flanges resting on a surface of the supporting structure when the electronics housing is mounted thereon and providing stability to the electronics housing when the electronics housing is mounted on the supporting structure.

9. A signal management (SM) electronics housing, which comprises:

a housing structure which defines an enclosure for containing therein electronic circuitry, the housing structure being mountable on a supporting structure, the housing structure having at least two opposite walls, each of the at least two opposite walls having formed therein at least one open slot; and a plurality of connectors, each connector of the plurality of connectors being receivable in a corresponding one of the open slots, the connectors being attachable to the supporting structure to selectively secure the electronics housing thereto;

wherein at least one connector of the plurality of connectors is a passive connector, and wherein at least another connector of the plurality of connectors is an active locking connector, the passive connector having a main connector body and at least one non-rotatable pin mounted on and extending from the main connector body, the active locking connector having a main connector body and a rotatable pin rotatably mounted on and extending from the main connector body of the active locking connector; and wherein the at least one open slot formed in each wall of the at least two opposite walls may selectively receive one of the passive connector, the active locking connector and a fastener.

10. A signal management (SM) electronics housing as defined by claim 9, wherein the fastener is a screw for mounting the electronics housing to a mounting support, the mounting support being different from the supporting structure.

* * * * *